United States Patent
Choi (10) Patent No.: US 10,032,687 B2
(45) Date of Patent: Jul. 24, 2018

(54) TEMPERATURE CONTROL DEVICE, SEMICONDUCTOR DEVICE INCLUDING THE SAME, AND METHOD FOR CONTROLLING THE SEMICONDUCTOR DEVICE

(71) Applicant: SK hynix Inc., Icheon-si Gyeonggi-do (KR)

(72) Inventor: Young Geun Choi, Suwon-si Gyeonggi-do (KR)

(73) Assignee: SK hynix Inc., Icheon-si (KR)

(*) Notice: Subject to any disclaimer, the term of this patent is extended or adjusted under 35 U.S.C. 154(b) by 28 days.

(21) Appl. No.: 15/477,729

(22) Filed: Apr. 3, 2017

(65) Prior Publication Data

US 2018/0114737 A1 Apr. 26, 2018

(30) Foreign Application Priority Data

Oct. 25, 2016 (KR) .................. 10-2016-0139386

(51) Int. Cl.
| | |
|---|---|
| *H01L 23/00* | (2006.01) |
| *H01L 23/34* | (2006.01) |
| *H01L 23/58* | (2006.01) |
| *G01K 13/00* | (2006.01) |
| *H01L 23/40* | (2006.01) |

(52) U.S. Cl.
CPC .............. *H01L 23/34* (2013.01); *G01K 13/00* (2013.01); *H01L 23/4012* (2013.01); *H01L 23/564* (2013.01); *H01L 23/58* (2013.01); *H01L 2023/4043* (2013.01)

(58) Field of Classification Search
CPC ....................................... H01L 23/34
See application file for complete search history.

(56) References Cited

U.S. PATENT DOCUMENTS

| | | | |
|---|---|---|---|
| 2012/0249219 A1* | 10/2012 | Shoemaker .............. | G01K 3/08 327/512 |
| 2015/0003172 A1 | 1/2015 | Kim et al. | |
| 2016/0148905 A1 | 5/2016 | Yu et al. | |

FOREIGN PATENT DOCUMENTS

| | | |
|---|---|---|
| KR | 1020150001570 A | 1/2015 |
| KR | 1020160060400 A | 5/2016 |

* cited by examiner

*Primary Examiner* — William Harriston
(74) *Attorney, Agent, or Firm* — William Park & Associates Ltd.

(57) ABSTRACT

A temperature control device for controlling a temperature of a semiconductor device including a first chip and a second chip. The temperature control device may be configured to generate a correction temperature based on internal temperatures of the semiconductor device.

19 Claims, 6 Drawing Sheets

| TEMPERATURE | REFRESH CYCLE |
|---|---|
| $T_4 \sim T_5$ | $tREFI\_4$ |
| $T_3 \sim T_4$ | $tREFI\_3$ |
| $T_2 \sim T_3$ | $tREFI\_2$ |
| $T_1 \sim T_2$ | $tREFI\_1$ |
| $T_0 \sim T_1$ | $tREFI\_0$ |

TEMPERATURE CONTROL DEVICE, SEMICONDUCTOR DEVICE INCLUDING THE SAME, AND METHOD FOR CONTROLLING THE SEMICONDUCTOR DEVICE

CROSS-REFERENCE TO RELATED APPLICATION

This application claims priority based upon Korean patent application No. 10-2016-0139386, filed on Oct. 25, 2016, the disclosure of which is hereby incorporated in its entirety by reference herein.

BACKGROUND

1. Technical Field

Embodiments of the present disclosure may generally relate to a temperature control device, a semiconductor device including the same, and a method for controlling the semiconductor device, and more particularly to temperature estimation.

2. Related Art

Unique characteristics of the semiconductor device may be changed according to a temperature of the semiconductor device. For example, a charge retention time of each memory cell contained in the memory device such as DRAM may be reduced. Accordingly, the semiconductor device includes a temperature sensor for detecting a temperature. The semiconductor device may control a variation in characteristics using the temperature sensor.

However, although the semiconductor device includes the temperature sensor, the temperature sensor may incorrectly detect a temperature of the semiconductor device under a specific environment. In this case, it may be impossible to correctly control characteristics of the semiconductor device.

SUMMARY

In accordance with an embodiment of the present disclosure, a temperature control device may be provided. In accordance with an embodiment of the present disclosure, a semiconductor device may be provided. In accordance with an embodiment of the present disclosure, a method for controlling a semiconductor device may be provided. The temperature control device may be configured to generate a correction temperature based on internal temperatures of the semiconductor device.

DETAILED DESCRIPTION

Reference will now be made to the embodiments of the present disclosure, examples of which are illustrated in the accompanying drawings. Wherever possible, the same reference numbers will be used throughout the drawings to refer to the same or like parts.

Various embodiments of the present disclosure may be directed to providing a temperature control device, a semiconductor device including the same, and a method for controlling the semiconductor device, that substantially obviate one or more problems due to limitations and disadvantages of the related art.

Figure 1A:
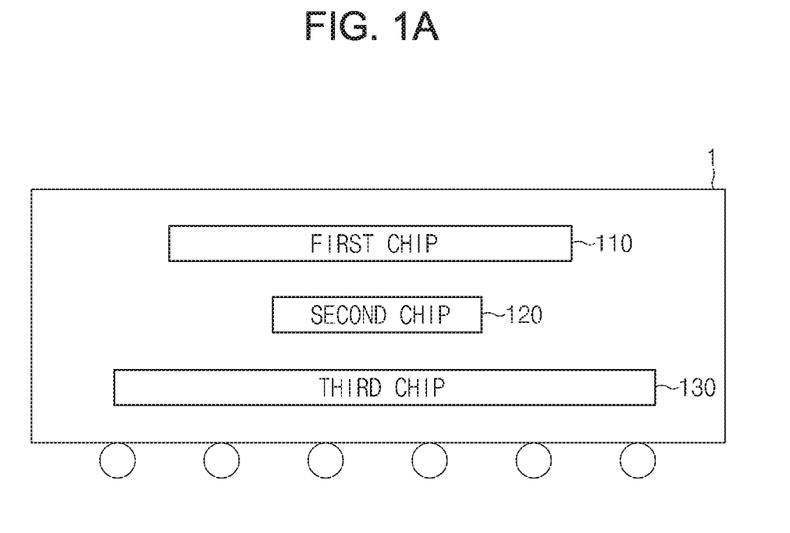
FIG. 1A is a side view illustrating an example of a semiconductor device according to an embodiment of the present disclosure.
Figure 1B:
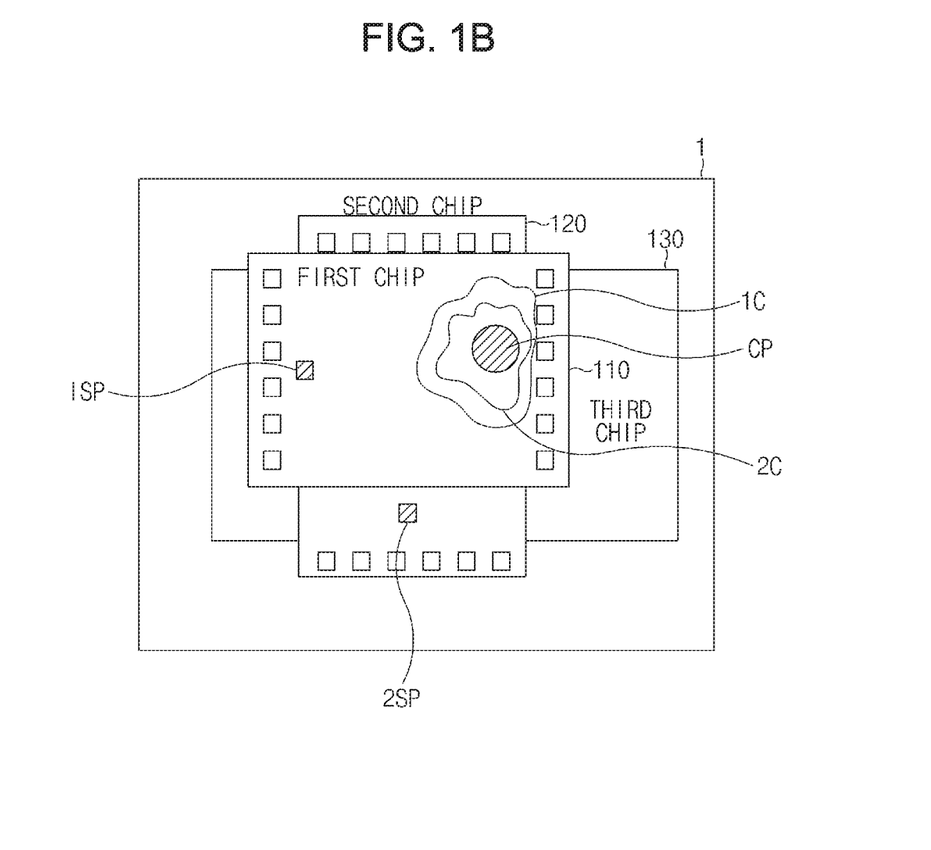
FIG. 1B is a top view illustrating an example of a semiconductor device according to an embodiment of the present disclosure.

FIG. 1A is a side view illustrating an example of a semiconductor device 1 according to an embodiment of the present disclosure. FIG. 1B is a top view illustrating an example of a semiconductor device 1 according to an embodiment of the present disclosure.

Referring to FIGS. 1A and 1B, the semiconductor device 1 may include a first chip 110, a second chip 120, and a third chip 130. Each of the first to third chips 110~130 may be formed in a two-dimensional (2D) plate shape. The semiconductor device 1 may include a stacked structure in which the first to third plate-shaped chips 110~130 are vertically arranged.

For example, the first and second chips 110 and 120 may be memory chips such as DRAMs. The third chip 130 may be, for example, a memory controller. In this case, the memory controller may be an independent chip acting as a device for controlling the memory chip, or may be integrated with an application processor as necessary.

A region of the semiconductor device 1 having the stacked structure may be reduced in size as compared to the other semiconductor devices in which the first to third chips 110-130 are arranged on the same plane. Therefore, the semiconductor device 1 having the structure of FIG. 1 may be applied to a device, such as a mobile device, having a large areal restriction.

The chips 110~130 of the semiconductor device 1 having the stacked structure may be arranged contiguously with each other in a vertical direction. However, for illustrative purposes FIG. 1A illustrates that the chips 110~130 are spaced apart for ease of viewing. Therefore, heat emitted from the contiguous chips may affect other chips, such that the emitted heat may be incorrectly detected by the temperature sensor.

For example, as illustrated in FIG. 1B, heat may be generated from a circular portion CP of the third chip 130. For illustrative purposes FIG. 1B illustrates a first cut away portion 1C and a second cut away portion 2C of the first and second chips 110 and 120 respectively such that the circular portion CP of the third chip 130 may be viewed from the top view of the illustration. A temperature sensor may be located in each square portion of the first and second chips 110 and 120. For example, the square portion 1SP is for the first chip 110 and the square portion 2SP is for the second chip 120. In this case, the temperature sensors of the first chip 110 and the second chip 120 may incorrectly account for heat generated from the third chip 130. In other words, when the first chip 110 and the second chip 120 are respectively controlled on the basis of a measurement value of the first chip 110 and a measurement value of the second chip 120, a measurement temperature acquired from a part contiguous to the third chip 130 within the first chip 110 and the second chip 120 may be higher than an actual measurement temperature acquired from each temperature sensor.

For this purpose, at least one additional temperature sensor may be mounted to each of the first chip 110 and the second chip 120 as necessary. However, due to the installation of the additional temperature sensor, a production cost of the semiconductor device may unavoidably increase. In addition, in order to perform correct temperature measurements, the number of additional temperature sensors must be increased, resulting in difficulties relating to the arrangement of the temperature sensors.

Therefore, when characteristics of the first chip 110 or the second chip 120 are adjusted according to a temperature, an embodiment of the present disclosure aims to adjust temperature characteristics of the respective chips 110 and 120 by accounting for not only a temperature of the first chip 110 or the second chip 120 but also a temperature of the third chip 130.

Figure 2:
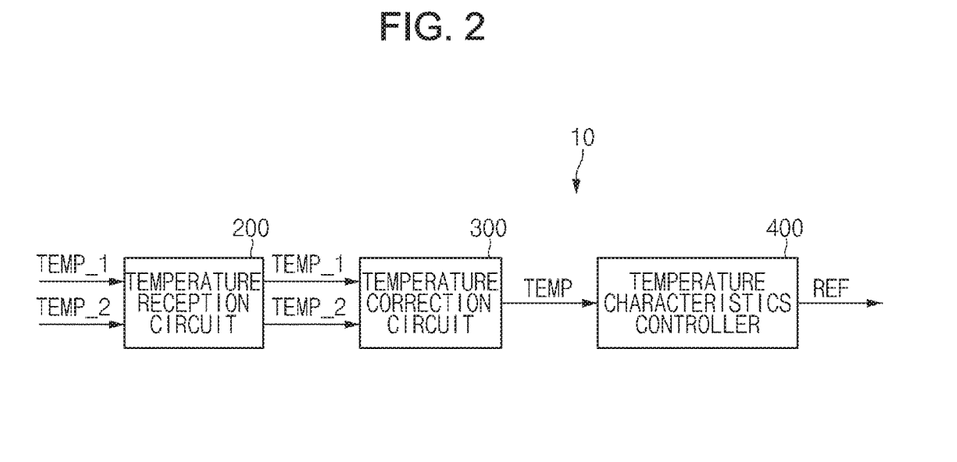
FIG. 2 is a block diagram illustrating an example of a temperature control device according to an embodiment of the present disclosure.

FIG. 2 is a block diagram illustrating an example of a temperature control device 10 according to an embodiment of the present disclosure.

Referring to FIG. 2, the temperature control device 10 according to an embodiment may include a temperature reception circuit 200, a temperature correction circuit 300, and a temperature characteristics controller 400.

The temperature reception circuit 200 may receive a first temperature signal TEMP_1 and a second temperature signal TEMP_2 respectively transmitted from the plurality of chips. For example, the first temperature signal TEMP_1 may be a value transmitted from the temperature sensor contained in the first chip 110 or the second chip 120. For example, the second temperature signal TEMP_2 may be a value transmitted from the temperature sensor contained in the third chip 130.

The temperature correction circuit 300 may generate a correction temperature signal TEMP on the basis of the first temperature signal TEMP_1 and the second temperature signal TEMP_2. For example, the correction temperature signal TEMP may be the higher of the two temperatures from among the first temperature signal TEMP_1 and the second temperature signal TEMP_2. However, the embodiments are not limited in this way and any of the two temperatures from among the first temperature signal TEMP_1 and the second temperature signal TEMP_2 may be chosen as the correction temperature signal TEMP.

The temperature characteristics controller 400 may control temperature characteristics of the semiconductor device 1 on the basis of the correction temperature signal TEMP. For example, assuming that each of the first chip 110 and the second chip 120 is a memory chip, the temperature characteristics controller 400 may adjust a refresh cycle (tREFI) of the first chip 110 or the second chip 120 on the basis of the correction temperature signal TEMP. A refresh signal REF may be generated at intervals of the adjusted refresh cycle (tREFI). Examples of operations of the temperature characteristics controller 400 will hereinafter be described with reference to FIG. 3.

Figure 3:
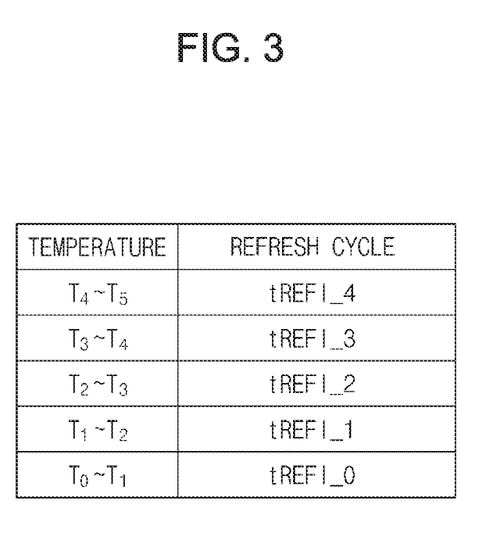
FIG. 3 illustrates an example of a refresh cycle table contained in a temperature characteristics controller.

FIG. 3 illustrates an example of a refresh cycle table contained in a temperature characteristics controller 400.

Referring to the refresh cycle table of FIG. 3, temperatures may be divided into a plurality of temperature sections, and different refresh cycles (tREFI; tREFI_0~tREFI_4) may be allocated to the respective sections.

In the refresh cycle table of FIG. 3, various refresh operation cycles may be established. For example, in the lowest temperature section (T0~T1), the refresh signal REF may be generated per refresh cycle (tREFI_0). In a subsequent temperature section (T1~T2) located above the temperature section (T0~T1), the refresh signal REF may be generated per refresh cycle (tREFI_1). In a temperature section (T2~T3) located above the temperature section (T1~T2), the refresh signal REF may be generated per refresh cycle (tREFI_2). In a temperature section (T3~T4) located above the temperature section (T2~T3), the refresh signal REF may be generated per refresh cycle (tREFI_3). In the highest temperature section (T4~T5) located above the temperature section (T3~T4), the refresh signal REF may be generated per refresh cycle (tREFI_4). In an embodiment, for example, the temperature section (T4~T5) may correspond to temperatures that are higher than temperatures of temperature section (T3~T4). the temperature section (T3~T4) may correspond to temperatures that are higher than temperatures of temperature section (T2~T3), the temperature section (T2~T3) may correspond to temperatures that are higher than temperatures of temperature section (T1~T2), and the temperature section (T1~T2) may correspond to temperatures that are higher than temperatures of temperature section (T0~T1).

In this case, each of the refresh cycles tREFI_0~tREFI_4 may be gradually reduced in proportion to the increasing temperature. Therefore, each of the chips 110 and 120 may be frequently refreshed according to the increasing temperature, such that charge retention characteristics of each memory cell may be maintained at a predetermined level or higher.

The temperature characteristics controller 400 may generate the refresh signal REF at intervals of a refresh cycle corresponding to a temperature section to which the correction temperature TEMP pertains. For example, assuming that the first temperature TEMP_1 is higher than the second temperature TEMP_2, the temperature correction circuit 300 may generate the second temperature TEMP_2 as a corrected temperature value. The temperature characteristics controller 400 may transmit the refresh signal REF according to the refresh cycle established on the basis of the second temperature TEMP_2, instead of according to the refresh cycle established on the basis of the first temperature TEMP_1 indicating a temperature of the first chip 110 or the second chip 120. Therefore, the refresh cycle of the first chip 110 or the second chip 120 is reduced and the refresh operation is frequently carried out, resulting in improvement of refresh characteristics of the first chip 110 or the second chip 120.

Figure 4:
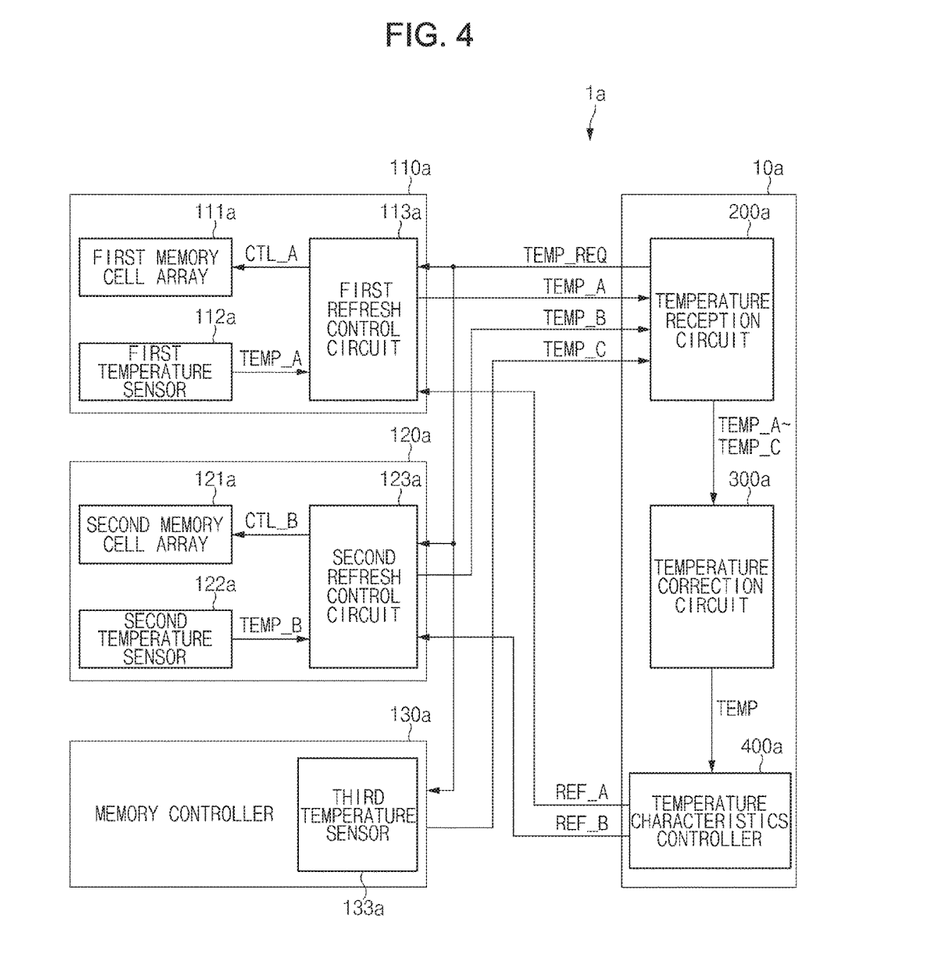
FIG. 4 is a block diagram illustrating a semiconductor device having a temperature control device of FIG. 2.

FIG. 4 is a block diagram illustrating a semiconductor device 1a having the temperature control device 10a illustrated in FIG. 2.

Referring to FIG. 4, the semiconductor device 1a may include a first memory chip 110a, a second memory chip 120a, a memory controller 130a, and a temperature control device 10a. The first memory chip 110a and the second memory chip 120a may respectively correspond to the first chip 110 and the second chip 120 of FIG. 1, and the memory controller 130a may correspond to the third chip 130 of FIG. 1

As can be seen from FIG. 4, the temperature control device 10a may be independent of the memory controller 130a. However, the temperature control device 10a may be integrated with the memory controller 130a as necessary.

The first memory chip 110a may include a first memory cell array 111a, a first temperature sensor 112a, and a first refresh control circuit 113a.

The second memory chip 120a may include a second memory cell array 121a, a second temperature sensor 122a, and a second refresh control circuit 123a.

The temperature control device 10a may include a temperature reception circuit 200a, a temperature correction circuit 300a, and a temperature characteristics controller 400a.

Each of the first memory cell array 111a and the second memory cell array 121a may include a plurality of memory cells arranged in, for example but not limited to, a matrix shape.

Each memory cell may include a capacitor for storing data therein and a transistor for controlling the capacitor to be coupled to a word line and a bit line. If a specific word line is selected, a transistor coupled to the corresponding word line may be turned on, and a potential of the memory cell corresponding to the word line may be output to the bit line.

The potential of the memory cell may be gradually reduced as time goes by. That is, the capacitor used as a memory cell may discharge its own charges as time goes by, resulting in occurrence of lost data. Therefore, in order to guarantee data reliability, the refresh operation for recovering charges of the memory cell needs to be performed.

The charge retention time of the memory cell may be changed according to a temperature. Accordingly, the refresh cycle of the memory cell needs to be adjusted according to a temperature.

The temperature control device 10a may transmit a temperature request signal TEMP_REQ to the first refresh control circuit 113a of the first memory chip 110a and the second refresh control circuit 123a of the second memory chip 120a.

Upon receiving the temperature request signal TEMP_REQ, the first refresh control circuit 113a of the first memory chip 110a may transmit the first temperature TEMP_A of the first temperature TEMP_A signal measured by the first temperature sensor 112a to the temperature control device 10a. The first temperature TEMP_A of the first temperature TEMP_A signal may include a temperature of the first memory cell array 111a of the first memory chip 110a. The first temperature sensor 112a may be mounted to the installation position of the first memory cell array 111a contained in the first memory chip 110a in such a manner that the first temperature TEMP_A of the first temperature signal TEMP_A of the first memory cell array 111a can be measured by the first temperature sensor 112a.

Upon receiving the temperature request signal TEMP_REQ, the second refresh control circuit 123a of the second memory chip 120a may transmit the second temperature TEMP_B of the second temperature TEMP_B signal measured by the second temperature sensor 122a to the temperature control device 10a. The second temperature TEMP_B signal may include a temperature of the second memory cell array 121a of the second memory chip 120a. The second temperature sensor 122a may be mounted to the installation position of the second memory cell array 121a contained in the second memory chip 120a in such a manner that the second temperature TEMP_B of the second temperature TEMP_B signal of the second memory cell array 121a can be measured.

Upon receiving the temperature request signal TEMP_REQ, the memory controller 130a may transmit a third temperature TEMP_C included in the third temperature TEMP_C signal measured by the third temperature sensor 133a to the temperature control device 10a. The third temperature TEMP_C included in the third temperature TEMP_C signal may be a temperature of the memory controller 130a.

The temperature reception circuit 200a of the temperature control device 10a may receive the first temperature TEMP_A signal from the refresh control device 113a of the first memory chip 110a, may receive the second temperature TEMP_B signal from the refresh control circuit 123a of the second memory chip 120a, and may receive the third temperature TEMP_C signal of the memory controller 130a.

The temperature correction circuit 300a of the temperature control device 10a may generate a correction temperature TEMP on the basis of the first temperature TEMP_A signal, the second temperature TEMP_B signal, and the third temperature TEMP_C signal. For example, the correction temperature TEMP signal may be the highest of the three temperatures from among the first temperature TEMP_A signal, the second temperature TEMP_B signal, and the third temperature TEMP_C signal. However, the embodiments are not limited in this way and any of the three temperatures from among the first temperature TEMP_A signal, the second temperature TEMP_B signal, and the third temperature TEMP_C signal. may be chosen as the correction temperature TEMP signal.

The temperature characteristics controller 400a of the temperature control device 10a may control temperature characteristics of the first memory chip 110a and the second memory chip 120a on the basis of the correction temperature TEMP signal. For example, the temperature characteristics may be denoted by a refresh cycle. The temperature characteristics controller 400 may include the refresh cycle table depending on a temperature as illustrated in FIG. 3, and may generate refresh signals REF_A and REF_B at intervals of the refresh cycle corresponding to the correction temperature included in the correction temperature TEMP signal.

For example, assuming that the temperature gradually increases in the order of the first temperature TEMP_A, the second temperature TEMP_B, and the third temperature TEMP_C, the temperature control device 10a may generate the refresh signal on the basis of the third temperature TEMP_C indicating the highest temperature. In other words, as can be seen from the refresh cycle table, the temperature control device 10a may generate the refresh signals REF_A and REF_B at intervals of the refresh cycle corresponding to the third temperature TEMP_C, such that the temperature control device 10a may transmit the generated refresh signals REF_A and REF_B to the first memory chip 110a and the second memory chip 120a.

The first refresh control circuit 113a of the first memory chip 110a and the second refresh control circuit 123a of the second memory chip 120a may respectively transmit control signals CTL_A and CTL_B to the memory cell array 111a and the memory cell array 121a upon receiving refresh signals REF_A and REF_B from the temperature control device 10a, and may thus perform the refresh operation.

Therefore, as illustrated in FIG. 4, even when the first temperature sensor 112a of the first memory chip 110a or the second temperature sensor 122a of the second memory chip 120a incorrectly reflects the internal temperature, the refresh operation may be carried out on the basis of the third temperature TEMP_C indicating a corrected temperature. That is, when different temperatures of the memory cell array 111a or 121a are allocated to the respective regions and the temperature sensor 112a or 122a is arranged only in some regions of the memory cell array 111a or 121a, the temperature sensor 112a or 122a may not detect the highest temperature of the memory cell array 111a or 121a.

In this case, the temperature control device 10a may control the refresh cycle in consideration of a temperature of another chip (i.e., the memory controller 130a). That is, the temperature control device 10a may establish the refresh cycle on the basis of the highest region from among the regions of the memory cell arrays 111a and 121a. Accordingly, the refresh operation may be frequently carried out, such that charge retention characteristics of the memory cell can be maintained at a predetermined level or higher. In an embodiment, for example, the temperature control device 10a may establish the refresh cycle on the basis of the any region from among the regions of the memory cell arrays 111a and 121a based on which temperature signal (i.e., TEMP_A-TEMP_C signal) is chosen by the temperature characteristics controller (i.e. 400 and 400a). Accordingly, in an embodiment for example, the refresh operation with a refresh cycle may be carried out with the temperature section associated to that refresh cycle according to the temperature included in the temperature signal.

Figure 5:
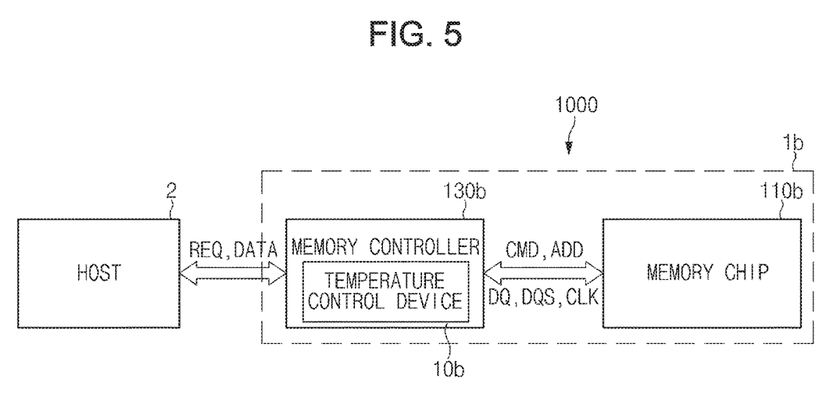
FIG. 5 is a block diagram illustrating a semiconductor system having a semiconductor device according to an embodiment of the present disclosure.

FIG. 5 is a block diagram illustrating a semiconductor system 1000 having a semiconductor device 1b according to an embodiment of the present disclosure.

Although FIG. 4 illustrates signals of the respective devices on the basis of the temperature control device 10a for convenience of description and better understanding of the present disclosure, FIG. 5 illustrates flow of general data.

Referring to FIG. 5, the semiconductor system may include a host 2 and a semiconductor device 1b (i.e., a memory module), and the semiconductor device 1b may include a memory controller 130b and a memory chip 110b.

The host 2 may transmit a request REQ and data DATA to the memory controller 130b to access the memory chip 110b. The host 2 may transmit data DATA to the memory controller 130b to store data DATA in the memory chip 110b. In addition, the host 2 may receive data DATA from the memory chip 110b through the memory controller 130b. The memory controller 130b may control the memory chip 110b to transmit data information, address information, memory setup information, a write request, a read request, etc. to the memory chip 110b in response to the request REQ, such that the write or read operation can be performed. The memory controller 130b may relay communication between the host 2 and the memory chip 110b. The memory controller 130b may receive the request REQ and data DATA from the host 2, may generate data DQ, a data strobe DQS, a command CMD, a memory address ADD, a clock CLK, etc. to control the memory chip 110b, and may transmit the generated result to the memory chip 110b. In addition, the memory controller 130b may output the data DQ and the data strobe DQS transmitted from the memory chip 110b to the host 2.

The temperature control device 10b may be contained in the memory controller 130b. The temperature control device 10b may control temperature characteristics (i.e., refresh cycle) of the memory chip 110b on the basis of the temperature of the memory chip 110b and the temperature of the memory controller 130b. In an embodiment for example, the temperature control device 10b may include for example the temperature control devices associated and discussed with regards to FIGS. 1-4.

Although FIG. 5 illustrates that the host 2 and the memory controller 130b are physically separated from each other, the memory controller 130b may be embedded in a processor of the host 2 (for example, a Central Processing Unit (CPU), an Application Processor (AP), a Graphic Processing Unit (GPU), etc.), or may be configured in the form of a System on Chip (SoC) and be fabricated in one chip along with the processors.

The memory chip 110b may receive a command CMD, an address ADD, data DQ, a data strobe DQS, a clock signal CLK, etc. from a memory controller 130b, and may receive data on the basis of signals.

The memory chip 110b may include a plurality of memory banks, and may store data DQ in a specific bank selected from among a plurality of memory banks on the basis of the address ADD. In addition, the memory chip 110b may transmit data on the basis of the command CMD, the address ADD, the data strobe DQS, etc. received from the memory controller 130b, and may thus perform data transmission. The memory chip 110b may transmit data stored in a specific bank selected from among memory banks to the memory controller 130b on the basis of the address ADD, the data DQ, and the data strobe DQS.

As is apparent from the above description, the embodiments of the present disclosure can provide a better estimate of a temperature of the semiconductor device, such that temperature characteristics of the semiconductor device can be more accurately controlled.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the disclosure have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A temperature control device for controlling a temperature of a semiconductor device including, at least, a first chip and a second chip, comprising:
   a temperature reception circuit configured to receive a first temperature signal including a first temperature of the first chip and a second temperature signal including a second temperature of the second chip;
   a temperature correction circuit configured to generate a correction temperature signal including a correction temperature which is the greater of the two temperatures from among the first temperature signal and the second temperature signal; and
   a temperature characteristics controller configured to control temperature characteristics of the semiconductor device on the basis of the correction temperature signal.

2. The temperature control device according to claim 1, wherein:

the first chip is a memory chip;
the second chip is a memory controller; and
the temperature characteristics controller controls a refresh cycle of the first chip based on the correction temperature.

3. The temperature control device according to claim 2, wherein:
the temperature characteristics controller includes a temperature table in which different refresh cycles are allocated to respective temperature sections; and
the temperature characteristics controller generates a refresh signal at intervals of a refresh cycle corresponding to the correction temperature, and transmits the generated refresh signal to the first chip.

4. The temperature control device according to claim 3, wherein a temperature section including the highest temperatures out of all of the temperature sections corresponds to refresh cycles with the lowest refresh cycles out of all of the refresh cycles that are allocated to the respective temperature sections.

5. The temperature control device according to claim 3, wherein the first chip is refreshed more frequently as the temperature of the semiconductor device increases.

6. A semiconductor device comprising:
a first chip configured to measure a first internal temperature and generate the measured first internal temperature; and
a second chip configured to measure a second internal temperature and generate the measured second internal temperature; and
a temperature control device configured to generate a correction temperature which is the greater of the two temperatures from among the measured first internal temperature and the measured second internal temperature, and control temperature characteristics of the first chip on the basis of the correction temperature.

7. The semiconductor device according to claim 6, wherein:
each of the first chip and the second chip is formed in a plate shape; and
the first chip and the second chip are stacked in a vertical direction.

8. The semiconductor device according to claim 6, wherein the temperature control device includes:
a temperature reception circuit configured to receive the measured first internal temperature of the first chip and the measured second internal temperature of the second chip;
a temperature correction circuit configured to generate the correction temperature based on the measured first internal temperature and the measured second internal temperature; and
a temperature characteristics controller configured to control temperature characteristics of the first chip based on the correction temperature.

9. The semiconductor device according to claim 8, wherein:
the first chip is a memory chip;
the second chip is a memory controller; and
the temperature characteristics controller controls a refresh cycle of the first chip based on the correction temperature.

10. The semiconductor device according to claim 9, wherein:
the temperature characteristics controller includes a temperature table in which different refresh cycles are allocated to respective temperature sections; and
the temperature characteristics controller generates a refresh signal at intervals of a refresh cycle corresponding to the correction temperature, and transmits the generated refresh signal to the first chip.

11. The semiconductor device according to claim 10, wherein the first chip includes:
a memory cell array; and
a refresh control circuit configured to refresh the memory cell array based on the refresh signal.

12. The semiconductor device according to claim 11, wherein the refresh control circuit is configured to refresh the memory cell array whenever receiving the refresh signal.

13. A method for controlling a semiconductor device comprising:
receiving, by a temperature control device, a first temperature from a first chip, and receiving a second temperature from a second chip;
generating, by the temperature control device, a correction temperature which is the greater of the two temperatures from among the first temperature and the second temperature; and
controlling, by the temperature control device, temperature characteristics of the first chip based on the correction temperature.

14. The method according to claim 13, wherein:
each of the first chip and the second chip is formed in a plate shape; and
the first chip and the second chip are stacked in a vertical direction.

15. The method according to claim 13, wherein:
a refresh control circuit of the first chip transmits the first temperature to the temperature control device based on a temperature request signal of the second chip.

16. The method according to claim 13, wherein:
the first chip is a memory chip;
the second chip is a memory controller; and
the controlling the temperature characteristics includes controlling a refresh cycle of the first chip based on the correction temperature.

17. The method according to claim 16, wherein the controlling the temperature characteristics includes:
generating a refresh signal at intervals of a refresh cycle corresponding to the correction temperature using a temperature table in which different refresh cycles are allocated to individual temperature sections; and
transmitting the generated refresh signal to the first chip.

18. The method according to claim 17, further comprising:
refreshing, by a refresh control circuit of the first chip, a memory cell array contained in the first chip whenever receiving the refresh signal.

19. The method according to claim 13, further comprising:
prior to receiving the first temperature and the second temperature, transmitting, by a temperature control device, a temperature request signal to the first chip and the second chip.

* * * * *